US008493249B2

(12) United States Patent
Mickle

(10) Patent No.: US 8,493,249 B2
(45) Date of Patent: Jul. 23, 2013

(54) COMPRESSION MATCH ENUMERATION

(75) Inventor: Benjamin A. Mickle, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 94 days.

(21) Appl. No.: 13/152,733

(22) Filed: Jun. 3, 2011

(65) Prior Publication Data

US 2012/0306670 A1    Dec. 6, 2012

(51) Int. Cl.
    *H03M 7/00*    (2006.01)
(52) U.S. Cl.
    USPC .............................................. 341/107; 341/87
(58) Field of Classification Search
    USPC ................ 702/19, 20; 341/87, 107, 51
    See application file for complete search history.

(56) References Cited

U.S. PATENT DOCUMENTS

| 5,442,350 | A | 8/1995 | Iyer et al. |
| 5,978,795 | A | 11/1999 | Poutanen et al. |
| 6,047,283 | A | 4/2000 | Braun |
| 6,751,624 | B2 * | 6/2004 | Christal et al. ................ 1/1 |
| 7,124,034 | B2 * | 10/2006 | Shibuya ...................... 702/20 |
| 8,099,415 | B2 * | 1/2012 | Luo et al. .................. 707/736 |
| 8,108,353 | B2 * | 1/2012 | Balachandran et al. ...... 707/664 |
| 2008/0036630 | A1 | 2/2008 | Lee et al. |
| 2010/0042596 | A1 | 2/2010 | Shinjo et al. |
| 2010/0293159 | A1 | 11/2010 | Zhang et al. |

FOREIGN PATENT DOCUMENTS

| JP | 2002269096 A | 9/2002 |
| WO | 2005064522 A1 | 7/2005 |

OTHER PUBLICATIONS

"International Search Report", Mailed Date: May 18, 2012, Application No. PCT/US2011/055532, Filed Date: Oct. 9, 2011, pp. 9.

Ferreira, et al., "On the Use of Suffix Arrays for Memory-Efficient Lempel-Ziv Data Compression", Retrieved at <<http://ieeexplore.ieee.org/stamp/stamp.jsp?tp=&arnumber=4976498>>, Mar. 18, 2009, p. 444.

Kasai, et al., "Linear-time longest-common-prefix computation in suffix arrays and its applications", Retrieved at <<http://www.cs.iastate.edu/~cs548/references/linear_lcp.pdf>>, Proceedings of the 12th Annual Symposium on Combinatorial Pattern Matching, 2001, pp. 181-192.

Iliopoulos, et al., "On Parallel Transformations of Suffix Arrays into Suffix Trees", Retrieved at <<http://web.iiit.ac.in/~abhishek_shukla/suffix/On%20parallel%20transformations%20of%20suffix%20arrays%20into%20suffix.pdf>>, In the Proceedings of 15th Australasian Workshop on Combinatorial Algorithms, 2004, pp. 1-11.

Larsson, Jesper N., "Extended Application of Suffix Trees to Data Compression", Retrieved at <<http://www.larsson.dogma.net/dccpaper.pdf>>, Proceedings of the Conference on Data Compression, 1996, pp. 10.

* cited by examiner

*Primary Examiner* — Brian Young
(74) *Attorney, Agent, or Firm* — Wolfe-SBMC

(57) ABSTRACT

In embodiments of compression match enumeration, a suffix array can be generated that is representative of data sequences stored in a memory buffer. The suffix array can then be converted into a trie structure that overwrites the suffix array in the memory buffer as the trie structure is generated in-place of the suffix array. The trie structure includes nodes that each represent one or more suffixes of the suffix array, where each consecutive suffix is either grouped with an existing node in the trie structure or added as a new node of the trie structure. Data sequence matches can then be enumerated as determined from the trie structure.

20 Claims, 4 Drawing Sheets

COMPRESSION MATCH ENUMERATION

BACKGROUND

Computing devices perform various techniques for data compression to compress data bytes thereby using less memory and other computing device resources to store, process, maintain, and/or communicate data. Conventional data compression techniques may be inefficient from a processing resources standpoint and/or may be unreliable at finding data matches (e.g., repeated byte sequences) to compress the data. For example, a key challenge for any LZ77 compression implementation, such as LZX and LZMA, is to efficiently and reliably find the data matches that produce the smallest compressed data.

Various LZ77 compression algorithms attempt to determine repeated byte sequences and encode the matches with a (distance, length) pair. As a compression algorithm processes a buffer from beginning to end, at each position, the possible matches are the byte sequences from earlier in the buffer that are the same as the bytes at the current position of the buffer. Shorter distances back into the buffer can be encoded with fewer bits, while longer lengths cover more data. A distance indicates the distance in bytes between data matches in the buffer, and the length indicates the number of data bytes that match. To achieve a good compression ratio, an algorithm should be able to enumerate the shortest distances for each possible length, for each position in the buffer. In order to be fast, the algorithm should not expend time enumerating matches that are not the shortest distance for their length. For example, in some position in a buffer, the full set of possible matches might be (distance=50, length=3), (100, 4), (120, 3), (150, 4), (200, 5). The algorithm would only enumerate (50, 3), (100, 4), and (200, 5) because the other two (120, 3) and (150, 4) are superseded by matches that are at least as long (e.g., lengths of 3 and 4), but closer in distance. In terms of optimization, the algorithm should quickly enumerate the Pareto frontier of matches, where the two optimization criteria are longer lengths and shorter distances.

The LZX algorithm uses a splay tree to determine compression matches and solve the problem. Splay trees are binary trees, where new elements are inserted at the root. This provides the property that the most-recent and therefore, the shortest-distance matches, are encountered first when the algorithm searches the tree to determine the matches. The algorithm performs poorly if the tree becomes unbalanced, such as if strings are inserted in alphabetical order, and in practice, the LZX algorithm scales poorly to large match histories.

The LZMA algorithm can use variants of hash chains, binary trees, and Patricia tries to determine compression matches and solve the problem. There are also techniques of space-efficient tree implementations that can solve the problem if they are modified with some notion of the most-recently-inserted data string at each node of the tree. However, these techniques are implemented to traverse a tree structure from the root of the tree down in hierarchy to the lower-level nodes, and they are suboptimal when the most recent match is also a long match.

SUMMARY

This Summary introduces simplified concepts of compression match enumeration, and the concepts are further described below in the Detailed Description and/or shown in the Figures. This Summary should not be considered to describe essential features of the claimed subject matter, nor used to determine or limit the scope of the claimed subject matter.

Compression match enumeration is implemented to enumerate all of the data match possibilities in stored data sequences utilizing a leaf-to-root trie structure. In embodiments, a suffix array can be generated that is representative of data sequences stored in a memory buffer. The suffix array can then be converted into a trie structure that overwrites the suffix array in the memory buffer as the trie structure is generated in-place of the suffix array. The trie structure includes nodes that each represent one or more suffixes of the suffix array, where each consecutive suffix is either grouped with an existing node in the trie structure or added as a new node of the trie structure. A suffix of the suffix array can be grouped with an existing node in the trie structure when the suffix has a common match length of the data sequence as the existing node. Data sequence matches can then be enumerated as determined from the trie structure.

In other embodiments, the suffix array is an array of buffer positions in the memory buffer, where the buffer positions are sorted alphabetically by a data string that begins a data sequence at a respective buffer position. The suffix array can be converted into the trie structure by incrementally updating the trie structure from the consecutive suffixes of the suffix array. The nodes of the trie structure each include a reference to a parent node, a common match length for the data sequences of descendant nodes (e.g., to include immediate child nodes of a node), and a buffer position of a most-recently-traversed descendant node. The trie structure can be generated based on: the trie structure includes one or more non-leaf nodes that each have at least two immediate child nodes; the common match length for the data sequences of the descendant nodes is maximal; and a total number of the nodes in the trie structure is minimized.

BRIEF DESCRIPTION OF THE DRAWINGS

Embodiments of compression match enumeration are described with reference to the following Figures. The same numbers may be used throughout to reference like features and components that are shown in the Figures.

DETAILED DESCRIPTION

Embodiments of compression match enumeration are described, and implemented to enumerate all of the data match possibilities in stored data sequences. Compression match enumeration, such as may be utilized with an LZ77 compression algorithm, utilizes a leaf-to-root trie structure to enumerate the data matches. In embodiments, a suffix array is generated that represents data sequences stored in a memory buffer. The suffix array is then converted into a trie structure that overwrites the suffix array in the memory buffer as the trie structure is generated in-place of the suffix array. The suffix array can be converted into the trie structure by incrementally updating the trie structure from the consecutive suffixes of the suffix array. Rather than storing references to child nodes of a node in the trie structure, which is generally complicated because nodes can have a variable number of child nodes, the nodes of the trie structure each include a reference to a parent node, a common match length for the data sequences of descendant nodes, and a buffer position of a most-recently-traversed descendant node. A descendant node can include an immediate child node of a node, or any other child node, grandchild node, or descendant node.

While features and concepts of compression match enumeration can be implemented in any number of different devices, systems, environments, networks, and/or configurations, embodiments of compression match enumeration are described in the context of the following example devices, systems, and methods.

Figure 1:
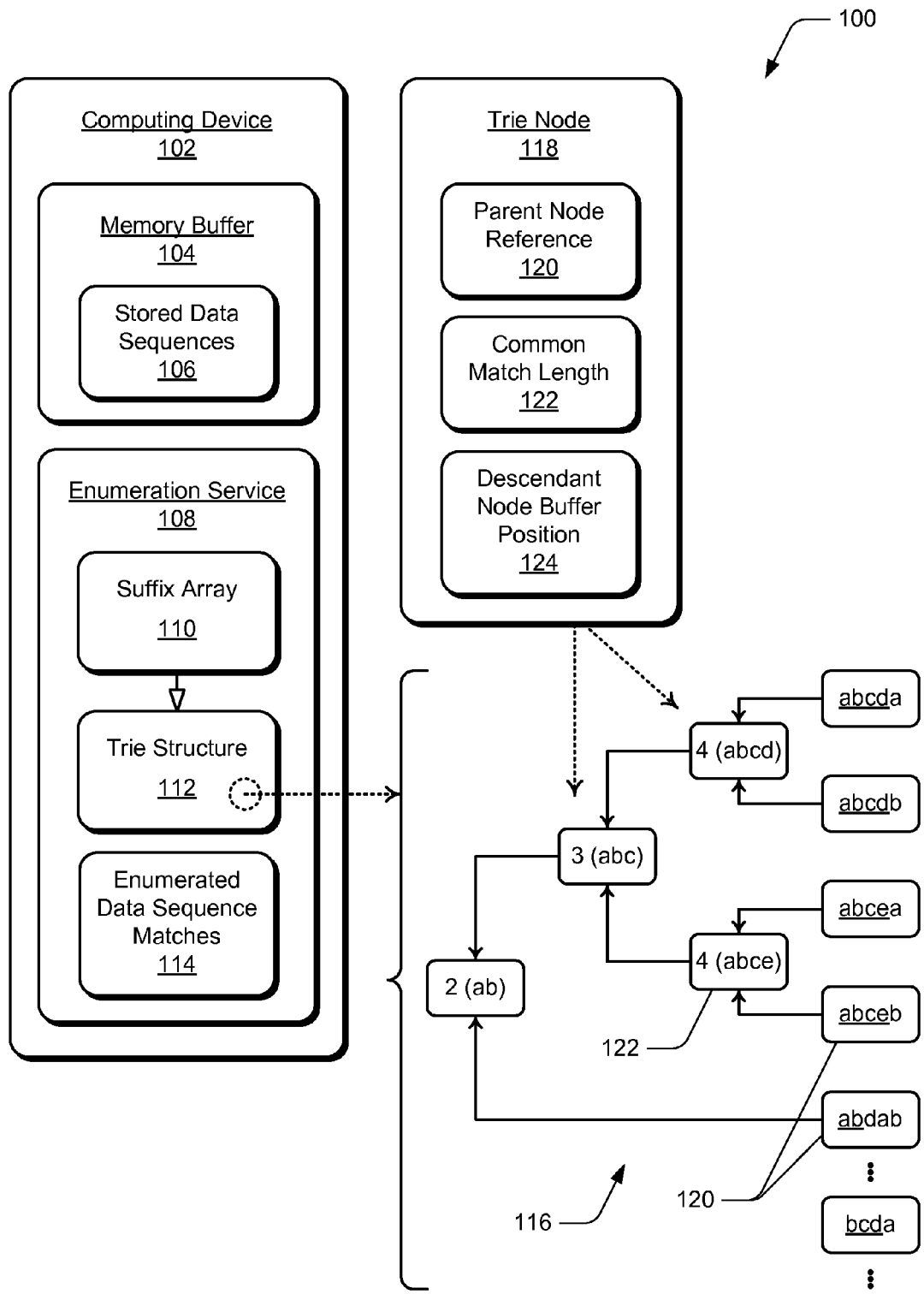
FIG. 1 illustrates an example system in which embodiments of compression match enumeration can be implemented.

FIG. 1 illustrates an example system 100 in which various embodiments of compression match enumeration can be implemented. The example system includes a computing device 102, which may be any type of server, computer, or device that performs enumerated compression data matching. Any of the computing devices referred to herein can be implemented with various components, such as one or more processors and memory devices, as well as any number and combination of differing components as further described with reference to the example device shown in FIG. 4.

In the example system 100, the computing device 102 includes a memory buffer 104 that stores or maintains stored data sequences 106. The memory buffer can be implemented as any type of computer-readable storage media that enables data storage, such as any type of memory, storage media, and/or suitable electronic data storage. The stored data sequences 106 are bytes stored in memory that may have repetitive byte sequences that can be recognized and compressed into a smaller representation of the data.

Embodiments of compression match enumeration are implemented to enumerate all of the data match possibilities in the stored data sequences. For example, a data string of "abacde" may begin a data sequence at a first buffer position. A first possible match of "abacfd" may be determined at a second buffer position, and the match can be represented by (length=4, distance=1000) for the four byte match of "abac" and the distance between the first buffer position and the second buffer position is 1000 bytes. A second possible match of "abacdf" may be determined at a third buffer position, and the match can be represented by (length=5, distance=10,000) for the five byte match of "abacd" and the distance between the first buffer position and the third buffer position is 10,000 bytes.

The computing device 102 also includes an enumeration service 108 that implements the embodiments of compression match enumeration described herein. The enumeration service can be implemented as computer-executable instructions, such as a software application and/or algorithm, and executed by one or more processors of the computing device. In this example, the enumeration service is shown implemented as a component of the computing device. Alternatively, the enumeration service may be configured as an independent software application, algorithm, or network-based service to implement the embodiments of compression match enumeration.

In embodiments, the enumeration service 108 is implemented to generate a suffix array 110 that is representative of the stored data sequences 106 that are stored in the memory buffer 104. The suffix array is an array of all the buffer positions (e.g., the suffixes) in the memory buffer, and the buffer positions may be sorted alphabetically by a data string that begins a data sequence at each of the respective buffer positions. Techniques to generate a suffix array are known, and any of various techniques can be implemented by the enumeration service to generate the suffix array.

The enumeration service 108 is implemented to then convert the suffix array 110 into a trie structure 112 that overwrites the suffix array in the memory buffer 104 as the trie structure is generated in-place of the suffix array. This conserves memory as no additional memory is needed to generate or construct the trie structure from the suffix array. The suffix array can be converted into the trie structure by incrementally updating the trie structure from consecutive suffixes of the suffix array. The trie structure is generated from leaf-to-root, rather than starting at the root node and progressively expanding down lower-level hierarchies. Leaf nodes are added to the trie structure to progressively contract toward, or determine, the root node of the trie structure. The enumeration service can then initiate searching the trie structure after the trie structure is generated, or constructed, to enumerate the data sequence matches 114 that are determined from the trie structure.

An example 116 of the trie structure 112 is shown with several trie nodes 118 that are generated from the suffixes of the suffix array 110. The trie structure includes leaf nodes, such as the example leaf nodes 120, that each correspond to a suffix of the suffix array 110. The trie structure also includes non-leaf nodes, such as example non-leaf node 122. A leaf node 120 may also be a child node to a parent node in the trie structure, whereas a non-leaf node 122 may be both a child node and a parent node in the trie structure.

The example 116 of the trie structure 112 only illustrates a few of the suffixes from a large data string in alphabetical order. The stored data sequences 106 in the memory buffer 104 may be a very large data set to which compression match enumeration is applied. The arrows represent parent node reference pointers and the numbers represent the common match length for the data sequences of all the descendant nodes, to include immediate child nodes, of a particular node. For example, the leaf node 120 that has the data sequence "abceb" includes a parent node reference to the non-leaf node 122, where the common match length of four (4) represents the data sequences of the two child nodes.

The trie structure can be efficiently constructed from the suffix array because, geometrically speaking, it is a planar diagram, where none of the parent node pointer lines will cross over each other when the trie structure is generated. As each subsequent leaf node 120 is connected in the trie structure 112 (and as non-leaf entries become un-referenceable by later entries), the set of nodes that a new leaf node may connect to is small due to this planar property, and this leads to the efficient and simple algorithm in embodiments of compression match enumeration.

The trie structure 112 is basically a tree where matching substrings are grouped under a common node, and those nodes are grouped under other nodes that effectively group shorter matches, and so on. Node-to-child node information is not needed or stored. Rather, a trie node 118 of the trie structure includes node fields for a parent node reference, a common match length for the data sequences of the descendant nodes (e.g., to include immediate child nodes), and a node buffer position of the most-recently-traversed descendant node. Both of the fields for the parent node reference and the common match length can be stored in one thirty-two (32) bit value, using for example, twenty-six (26) bits for the parent node reference index, and six (6) bits for the common data sequence length. Longer lengths can be capped at the maximum length storable in the thirty-two (32) bit value.

As the enumeration service 108 constructs the trie structure 112, three algorithm invariants of the enumeration service are maintained. First, every non-leaf node 122 has at least two immediate child nodes. Second, the common match length of a node's descendant nodes is maximal (e.g., if ten string positions have a length L in common, and two of the string positions have a length L+1 in common, then those two string positions are grouped under their own node). Third, within these constraints, the total number of nodes in the trie structure is minimized (e.g., if two string positions or subnodes can be grouped under a common node, then they must be grouped under the common node).

The enumeration service 108 processes the suffixes (e.g., buffer positions) of the suffix array 110 in the order that they occur in the suffix array, and makes decisions based on the longest common prefix fields that are computed along with the suffix array. A longest common prefix field indicates the length of how much a suffix matches the lexicographically closest suffix below it. A small stack of increasing match lengths is maintained, and the trie nodes 118 are constructed by unrolling the stack when the prefix length decreases. In an implementation, the stack is small because the match lengths are capped as six-bit numbers. The stack entries represent the set of all existing nodes to which future nodes might connect, or new leaf nodes 120 can be created as the trie structure 112 is generated. For each suffix of the suffix array, a suffix can be grouped with an appropriate-length existing node or used to generate a new leaf node of the trie structure. Non-leaf nodes are assigned a parent node as the stack is unrolled during the search for an appropriate-length node. These grouping decisions are based on the three algorithm invariants as described above.

Space for non-leaf nodes 122 in the trie structure 112 is allocated from the suffix array itself, and since it can be easily proven that the number of allocated non-leaf nodes is less that the number of processed suffixes, it is an "in-place" method that incrementally overwrites the suffix array 110 with the new trie structure. As described previous, this conserves memory because the two large data structures (e.g., the suffix array 110 and the trie structure 112) are not both stored at once. Each leaf node 120 corresponds to a suffix (e.g., a buffer position), and the parent node of each leaf node is stored by overwriting the inverse suffix array.

The enumeration service 108 also implements a match enumeration search method, and for each buffer position in order, follows the parent node pointers from a leaf node to the root node in the trie structure. Each non-leaf node 122 (e.g., also represented by the trie node 118) stores or maintains the parent node reference, the common match length, and the descendant node buffer position of the descendant node, to include an immediate child node, from which a non-leaf node was most-recently-traversed (e.g., the buffer position of the descendant node that most-recently "visited" the non-leaf node during this process). For subsequent traversal from other nodes, these node fields provide the shortest-distance data sequence backwards-match for each length along the leaf-to-root path from a leaf node to the root node. Subsequently, the only node field that changes about the trie structure during the search phase is the descendant node buffer position field for the most-recently-traversed descendant node associated with each non-leaf node.

If a most-recent match of a data sequence is also a long match and there are many shorter matches of different lengths represented in the trie structure 112, then the same data match may occur over and over as the trie structure is progressively traversed. For example, the shortest-distance match of a length ten (10) might also be the shortest-distance match of length nine (9), eight (8), seven (7), etc. A simple solution is to utilize eight bytes of memory for each non-leaf node in the trie structure, such as approximately four bytes for the parent node reference, approximately almost four bytes for the descendant node buffer position (e.g., the most-recently-seen position), and some bits for the common match length. However, using eight bytes per non-leaf node in the trie structure, and using four bytes per leaf node, will result in a total memory usage of twelve times the number of nodes (12n). This total memory usage can be reduced to eight times the number of nodes (8n) by only using four bytes per non-leaf node in the trie structure.

To save memory, the enumeration service takes advantage of the fact that leaf-to-parent references are only used in order, and once the data matches for a position have been looked up, the leaf data for that position is no longer needed. As the memory buffer 104 is traversed forward, memory space becomes available from what was formerly the inverse suffix array, which was overwritten while constructing the trie structure 112, and this available memory space can be used to store all of the information. In an implementation, a field is stored in the "parent node space" to look up the parent itself because this available memory space is not likely adjacent to the node parent storage. When the leaf-to-parent array is used as the additional memory, the most-recently-seen node field is nearly just such a field. Accordingly, in the non-leaf part of the trie structure (e.g., which used to be the suffix array), the parent node references are replaced with most-recently-seen positions, and the original parent node reference is then stored in the memory that was formerly used for the leaf parent node of the most-recently-seen position, which can then be reached by knowing the most-recently-seen position from the node. Thus, for each node that the search method traverses or visits, the three node fields can be determined for the parent node reference, the most-recently-traversed descendant node, and the common match length of the descendant nodes.

Not only does this save memory utilization, but also skips nodes in the trie structure 112 that do not need to be traversed when a data match that is both long and nearby is determined. This is because the most recent overall position is actually the most-recently-traversed (e.g., the most-recently-seen) position for each node in its leaf-to-root path, with memory space for only one parent node reference. A NULL reference can be initially stored to indicate that the parent node is the root node of the trie structure. Then, once the next node position is processed, the next node position becomes the most-recently-traversed as seen at the root node, and the parent reference of the previous most-recently-traversed position is updated so that the node that is common to both positions is referenced (which is, conveniently, the "current" node in the traversal). This is done at every node of the trie structure, and not just at the root node, which forces older positions further and further down the trie structure. This technique of continually changing and updating the trie structure is efficient at skipping unneeded steps when traversing the trie structure, such as enumerating the same match length multiple times or enumerating matches that are clearly suboptimal.

Figure 2:
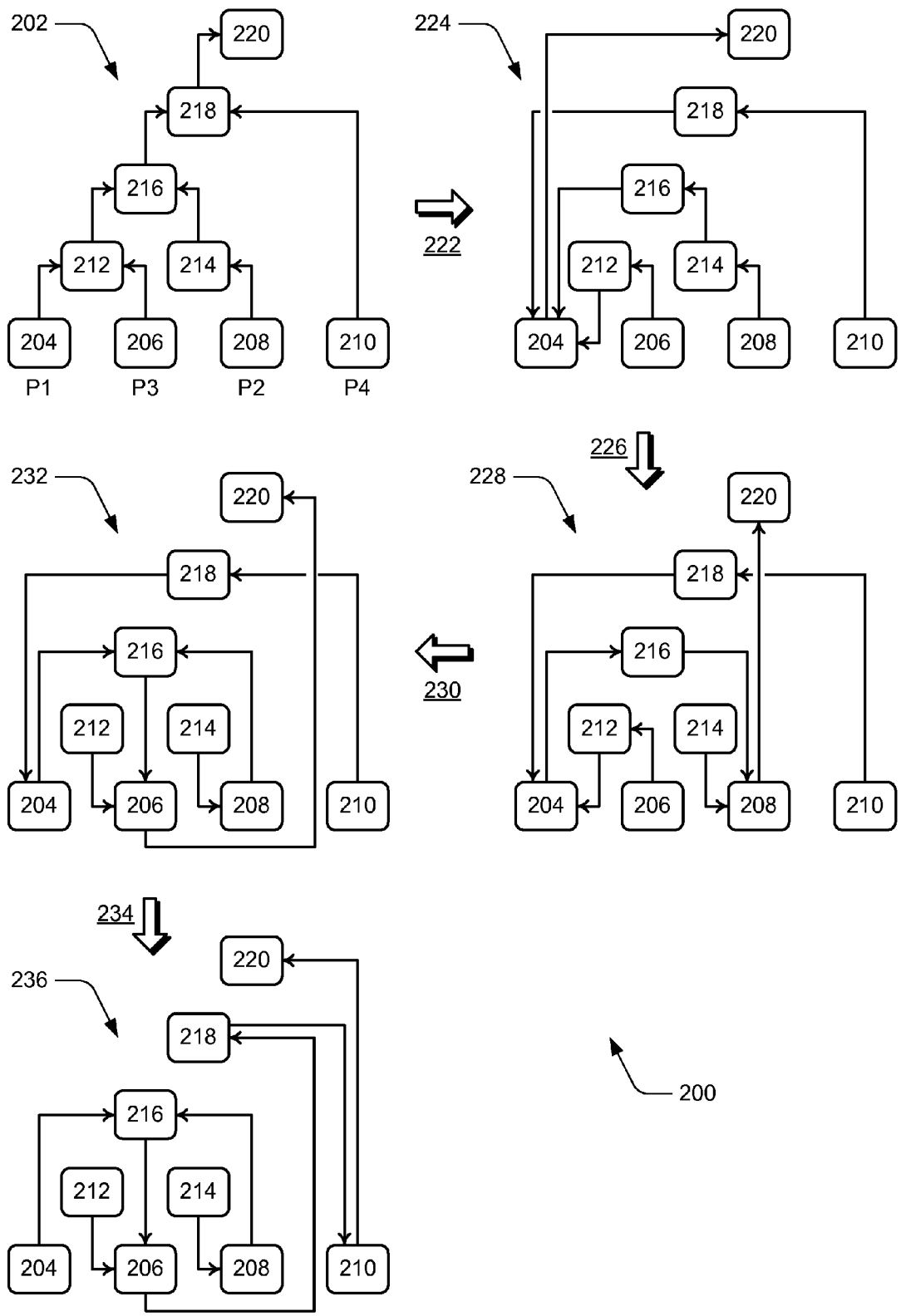
FIG. 2 illustrates an example of a trie structure and compression match enumeration in accordance with one or more embodiments.

FIG. 2 illustrates an example of a trie structure 200, and how the enumeration service 108 described with reference to FIG. 1 is implemented to search and update the trie structure in accordance with the embodiments of compression match enumeration described herein. The trie structure is shown at 202 as having been constructed when converted from a suffix array and prior to any match enumeration. The nodes of the trie structure are identified as nodes 204 through 220, and the bottom layer of leaf nodes are also identified as P1 through P4 to indicate an order in which the leaf nodes are processed by the enumeration service. Two basic tenets are followed to perform match enumeration: first, previously traversed non-leaf nodes point to the leaf node from which a non-leaf node was most-recently traversed, and second, the leaf nodes and not-yet-traversed nodes point to some non-leaf node (loosely referred to as the parent node, which may be the root node in some cases).

In a first transition 222 from the trie structure shown at 202 to the trie structure shown at 224, the enumeration service 108 attempts to enumerate the data matches for the suffix (e.g., buffer position) associated with leaf node 204 (e.g., the first processed leaf node P1). In this example, no matches are encountered for the first leaf node that is processed, but the trie structure is updated so that each node in the path from the leaf node 204 to the root node 220 now references its own respective leaf node (e.g., the most recent "visitor" of these nodes). For example, the path from leaf node 204 to the root node 220 is through nodes 212, 216, and 218. As each of these nodes are traversed, the respective node fields for the descendant node buffer position are updated to reference the leaf node 204. Additionally, the parent node reference field of the leaf node 204 is updated to reference the root node 220.

In a second transition 226 from the trie structure shown at 224 to the trie structure shown at 228, the enumeration service 108 follows a search path from leaf node 208 to enumerate the matches for the suffix associated with the leaf node (e.g., the second processed leaf node P2). In this example, a match of some length (unspecified in the diagram) is enumerated at the second non-leaf node 216 that is traversed (e.g., after the non-leaf node 214 is traversed). From the node 216, the position of the matching leaf node 204 can be determined (e.g., node 216 references to the leaf node 204 as shown at 224). The parent node to traverse next, which is the root node 220 in this example, is also determined from the parent node reference field of the leaf node 204 (e.g., node 204 references to the root node 220 as shown at 224). The non-leaf node 218 in the original leaf-to-root path for the leaf node 208 is skipped in this example, and will be handled as further described below. Additionally, the parent node reference field of the leaf node 208 is updated to reference the root node 220.

In a third transition 230 from the trie structure shown at 228 to the trie structure shown at 232, the enumeration service 108 follows a search path from leaf node 206 to enumerate the matches for the suffix associated with the leaf node (e.g., the third processed leaf node P3). In this example, two matches are enumerated at leaf node 204 and at leaf node 208. The parent node reference field at leaf node 208 is updated to reference node 216, and the non-leaf nodes 212 and 216 in the search path are updated to reference leaf node 206, which is the most-recent node to traverse the non-leaf nodes 212 and 216. Additionally, the parent node reference field of the leaf node 206 is updated to reference the root node 220.

In a final transition 234 from the trie structure shown at 232 to the trie structure shown at 236, the enumeration service 108 follows a search path from leaf node 210 (e.g., the fourth processed leaf node P4). The non-leaf node 218 is encountered, which is the node that was skipped above in the original leaf-to-root path for the leaf node 208. The non-leaf node 218 still references to the first leaf node 204, which references to its parent node 216 that is below the non-leaf node 218 in the trie structure. This may appear to be problematic because the search path should traverse higher in the trie structure. However, this can be handled simply by detecting that the parent node 216 of the leaf node 204 has a longer length than the current non-leaf node 218. The enumeration service then continues to follow the search path from node 216 via node 206 until a node is encountered that has a shorter length than the current non-leaf node 218, which in this case is the root node 220, and the shorter length indicates an ancestor node rather than a descendant node. Accordingly, the parent node reference field of the leaf node 206 is updated to reference the non-leaf node 218, and the parent node reference field of the leaf node 208 is updated to reference the root node 220. The dynamic nature of the algorithm to follow the search path for each leaf node and traverse the trie structure precisely provides the enumerated matches at very little processing expense.

Example method 300 is described with reference to FIG. 3 in accordance with one or more embodiments of compression match enumeration. Generally, any of the services, functions, methods, procedures, components, and modules described herein can be implemented using software, firmware, hardware (e.g., fixed logic circuitry), manual processing, or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

Figure 3:
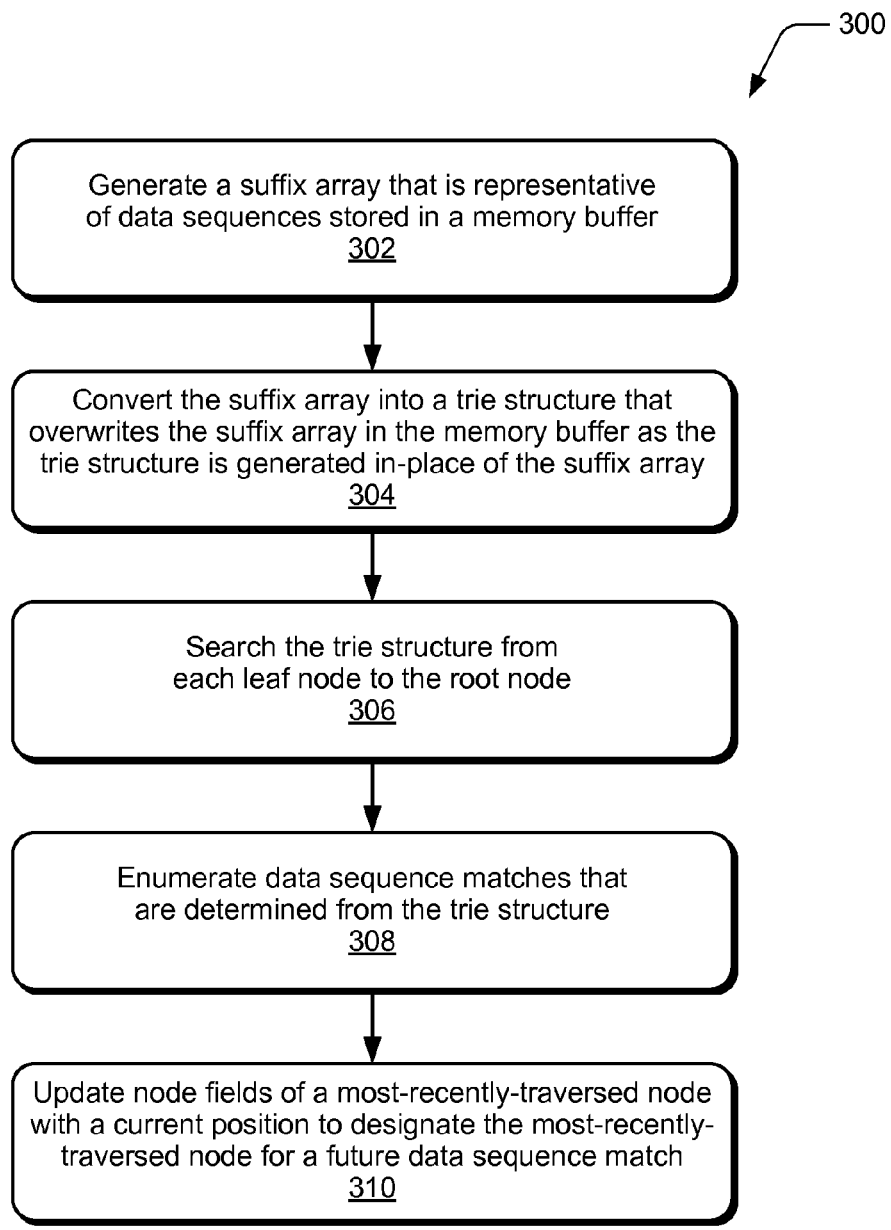
FIG. 3 illustrates example method(s) of compression match enumeration in accordance with one or more embodiments.

FIG. 3 illustrates example method(s) 300 of compression match enumeration. The order in which the method blocks are described are not intended to be construed as a limitation, and any number of the described method blocks can be combined in any order to implement a method, or an alternate method.

At block 302, a suffix array is generated that is representative of data sequences stored in a memory buffer. For example, the enumeration service 108 at the computing device 102 (FIG. 1) generates the suffix array 110 that represents the stored data sequences 106 that are stored in the memory buffer 104. The suffix array is an array of buffer positions in the memory buffer, and the buffer positions are sorted alphabetically by a data string that begins a data sequence at a respective buffer position.

At block 304, the suffix array is converted into a trie structure that overwrites the suffix array in the memory buffer as the trie structure is generated in-place of the suffix array. For example, the enumeration service 108 converts the suffix array 110 into the trie structure 112 and overwrites the suffix array in the memory buffer as the trie structure is generated in-place of the suffix array. The suffix array is converted into the trie structure by incrementally updating the trie structure from consecutive suffixes of the suffix array. The trie structure includes nodes that each represent one or more suffixes of the suffix array, and each consecutive suffix is either grouped with an existing node in the trie structure or added as a new node of the trie structure. A suffix of the suffix array can be grouped with an existing node in the trie structure when the suffix has a common match length of the data sequence as the existing node. Further, the trie structure is generated based on: the trie structure includes one or more non-leaf nodes that each have at least two immediate child nodes; the common match length for the data sequences of the descendant nodes is maximal; and a total number of the nodes in the trie structure is minimized.

At block 306, the trie structure is searched from each leaf node to the root node and, at block 308, data sequence matches are enumerated as determined from the trie structure. For example, the enumeration service 108 searches the trie structure 112 starting from each leaf node 204 (FIG. 2) and follows the path of parent node references to the root node 220 to enumerate the data sequence matches 114 that are determined from the trie structure 112.

At block 310, node fields of a most-recently-traversed node are updated with a current position to designate the most-recently-traversed node for a future data sequence match. For example, the enumeration service 108 updates the node fields of a most-recently-traversed node with a current position to designate the most-recently-traversed node for a future data sequence match. The node fields of a most-recently-traversed node include a reference to a parent node, a common match length for the data sequences of descendant nodes (e.g., to include immediate child nodes of a node), and a buffer position of a most-recently-traversed descendant node.

Figure 4:
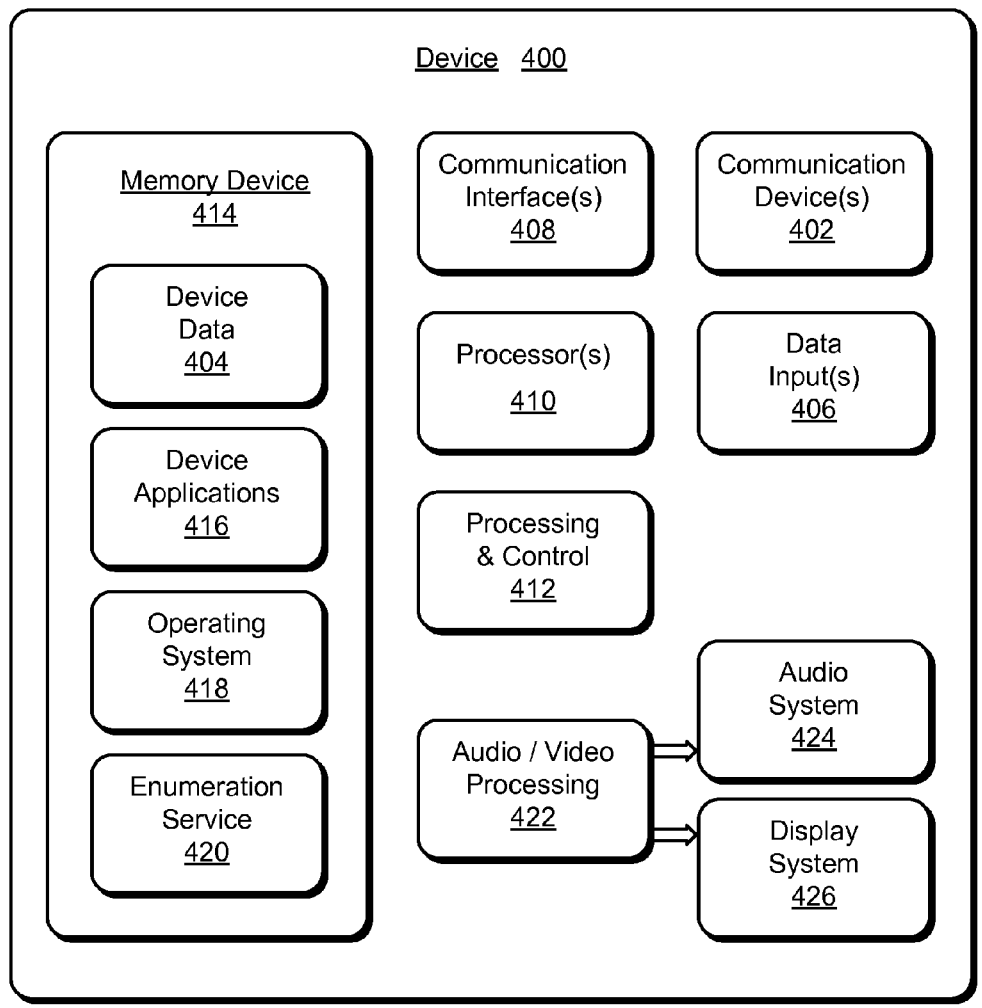
FIG. 4 illustrates various components of an example device that can implement embodiments of compression match enumeration.

FIG. 4 illustrates various components of an example device 400 that can be implemented as any of the devices, or services implemented by devices, described with reference to the previous FIGS. 1-3. In embodiments, the device may be implemented as any one or combination of a fixed or mobile device, in any form of a consumer, computer, portable, user, communication, phone, navigation, television, appliance, gaming, media playback, and/or electronic device. The device may also be associated with a user (i.e., a person) and/or an entity that operates the device such that a device describes logical devices that include users, software, firmware, hardware, and/or a combination of devices.

The device 400 includes communication devices 402 that enable wired and/or wireless communication of device data 404, such as received data, data that is being received, data scheduled for broadcast, data packets of the data, etc. The device data or other device content can include configuration settings of the device, media content stored on the device, and/or information associated with a user of the device. Media content stored on the device can include any type of audio, video, and/or image data. The device includes one or more data inputs 406 via which any type of data, media content, and/or inputs can be received, such as user-selectable inputs and any other type of audio, video, and/or image data received from any content and/or data source.

The device 400 also includes communication interfaces 408, such as any one or more of a serial, parallel, network, or wireless interface. The communication interfaces provide a connection and/or communication links between the device and a communication network by which other electronic, computing, and communication devices communicate data with the device.

The device 400 includes one or more processors 410 (e.g., any of microprocessors, controllers, and the like) which process various computer-executable instructions to control the operation of the device. Alternatively or in addition, the device can be implemented with any one or combination of software, hardware, firmware, or fixed logic circuitry that is implemented in connection with processing and control circuits which are generally identified at 412. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 400 also includes one or more memory devices 416 (e.g., computer-readable storage media) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device.

Computer readable media can be any available medium or media that is accessed by a computing device. By way of example, and not limitation, computer readable media may comprise storage media and communication media. Storage media include volatile and non-volatile, removable and non-removable media implemented in any method or technology for storage of information, such as computer-readable instructions, data structures, program modules, or other data. Storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by a computer.

Communication media typically embody computer-readable instructions, data structures, program modules, or other data in a modulated data signal, such as carrier wave or other transport mechanism. Communication media also include any information delivery media. A modulated data signal has one or more of its characteristics set or changed in such a manner as to encode information in the signal. By way of example, and not limitation, communication media include wired media such as a wired network or direct-wired connection, and wireless media such as acoustic, RF, infrared, and other wireless media.

A memory device 414 provides data storage mechanisms to store the device data 404, other types of information and/or data, and various device applications 416. For example, an operating system 418 can be maintained as a software application with the memory device and executed on the processors. The device applications may also include a device manager, such as any form of a control application, software application, signal processing and control module, code that is native to a particular device, a hardware abstraction layer for a particular device, and so on. In this example, the device applications 416 include an enumeration service 420 that implements embodiments of compression match enumeration as described herein.

The device 400 also includes an audio and/or video processing system 422 that generates audio data for an audio system 424 and/or generates display data for a display system 426. The audio system and/or the display system may include any devices that process, display, and/or otherwise render audio, video, display, and/or image data. Display data and audio signals can be communicated to an audio device and/or to a display device via an RF (radio frequency) link, S-video link, composite video link, component video link, DVI (digital video interface), analog audio connection, or other similar communication link. In implementations, the audio system and/or the display system are external components to the device. Alternatively, the audio system and/or the display system are integrated components of the example device, such as an integrated touch-screen display.

Although embodiments of compression match enumeration have been described in language specific to features and/or methods, the subject of the appended claims is not necessarily limited to the specific features or methods described. Rather, the specific features and methods are disclosed as example implementations of compression match enumeration.

The invention claimed is:

1. A method, comprising:
generating a suffix array that is representative of data sequences stored in a memory buffer, the suffix array generated as buffer positions in the memory buffer, the buffer positions ordered according to a data string that begins a data sequence at a respective buffer position;
converting the suffix array into a trie structure that overwrites the suffix array in the memory buffer as the trie structure is generated in-place of the suffix array; and
enumerating data sequence matches that are determined from the trie structure.

2. A method as recited in claim 1, wherein the suffix array is converted into the trie structure by incrementally updating the trie structure from consecutive suffixes of the suffix array.

3. A method as recited in claim 1, wherein the trie structure comprises nodes that each represent one or more suffixes of the suffix array, and wherein each consecutive suffix is either grouped with an existing node in the trie structure or added as a new node of the trie structure.

4. A method as recited in claim 3, wherein a suffix of the suffix array is grouped with an existing node in the trie structure when the suffix has a common match length of the data sequence as the existing node.

5. A method as recited in claim 1, wherein the trie structure comprises nodes that each include a reference to a parent node, a common match length for the data sequences of descendant nodes, and a buffer position of a most-recently-traversed descendant node.

6. A method as recited in claim 5, wherein the descendant nodes include immediate child nodes of a node, and wherein the trie structure is generated based on:
the trie structure includes one or more non-leaf nodes that each have at least two immediate child nodes;
the common match length for the data sequences of the descendant nodes is maximal; and
a total number of the nodes in the trie structure is minimized.

7. A method as recited in claim 1, further comprising searching the trie structure to enumerate the data sequence matches after generation of the trie structure is completed.

8. A method as recited in claim 1, further comprising updating node fields of a most-recently-traversed node with a current position to designate the most-recently-raversed node for a future data sequence match.

9. A computing device, comprising:
at least a memory and a processor to implement an enumeration service that is configured to:
generate a suffix array that is representative of data sequences stored in a memory buffer;
convert the suffix array into a trie structure that overwrites the suffix array in the memory buffer as the trie structure is generated in-place of the suffix array, the trie structure including nodes that each represent one or more suffixes of the suffix array, where each consecutive suffix is either grouped with an existing node in the trie structure or added as a new node of the trie structure; and
enumerate data sequence matches that are determined from the trie structure.

10. A computing device as recited in claim 9, wherein the enumeration service is further configured to group a suffix of the suffix array with an existing node in the trie structure when the suffix has a common match length of the data sequence as the existing node.

11. A computing device as recited in claim 9, wherein:
the suffix array is an array of buffer positions in the memory buffer, the buffer positions sorted alphabetically by a data string that begins a data sequence at a respective buffer position; and
the enumeration service is further configured to convert the suffix array into the trie structure by incrementally updating the trie structure from the consecutive suffixes of the suffix array.

12. A computing device as recited in claim 9, wherein the nodes of the trie structure each include a reference to a parent node, a common match length for the data sequences of descendant nodes, and a buffer position of a most-recently-traversed descendant node.

13. A computing device as recited in claim 12, wherein descendant nodes include immediate child nodes of a node, and wherein the enumeration service is further configured to generate the trie structure based on:
the trie structure includes one or more non-leaf nodes that each have at least two immediate child nodes;
the common match length for the data sequences of the descendant nodes is maximal; and
a total number of the nodes in the trie structure is minimized.

14. A computing device as recited in claim 9, wherein the enumeration service is further configured to search the trie structure to enumerate the data sequence matches after generation of the trie structure is completed.

15. One or more computer-readable storage media devices storing instructions that are executable and, responsive to executing the instructions, a computing device:
generates a suffix array that is representative of data sequences stored in a memory buffer;
converts the suffix array into a trie structure that overwrites the suffix array in the memory buffer as the trie structure is generated in-place of the suffix array, the trie structure including nodes that each represent one or more suffixes of the suffix array, where each consecutive suffix is either grouped with an existing node in the trie structure or added as a new node of the trie structure; and
searches the trie structure to enumerate data sequence matches that are determined from the trie structure.

16. One or more computer-readable storage media devices as recited in claim 15, further storing additional instructions that are executable and, responsive to executing the additional instructions, the computing device converts the suffix array into the trie structure by incrementally updating the trie structure from the consecutive suffixes of the suffix array.

17. One or more computer-readable storage media devices as recited in claim 15, further storing additional instructions that are executable and, responsive to executing the additional instructions, the computing device updates node fields of the nodes in the trie structure, the node fields of each node including a reference to a parent node, a common match length for the data sequences of descendant nodes, and a buffer position of a most-recently-traversed descendant node.

18. One or more computer-readable storage media devices as recited in claim 17, further storing additional instructions that are executable and, responsive to executing the additional instructions, the computing device generates the trie structure based on:
the descendant nodes include immediate child nodes of a node;
the trie structure includes one or more non-leaf nodes that each have at least two immediate child nodes;
the common match length for the data sequences of the descendant nodes is maximal; and a total number of the nodes in the trie structure is minimized.

19. One or more computer-readable storage media devices as recited in claim 15, further storing additional instructions that are executable and, responsive to executing the additional instructions, the computing device searches the trie structure to enumerate the data sequence matches after generation of the trie structure is completed.

20. One or more computer-readable storage media devices as recited in claim 15, further storing additional instructions that are executable and, responsive to executing the additional instructions, the computing device generates the suffix array as buffer positions in the memory buffer, wherein the buffer positions are ordered according to a data string that begins a data sequence at a respective buffer position.

* * * * *